(12) United States Patent
Oliaei (10) Patent No.: US 7,042,377 B2
(45) Date of Patent: May 9, 2006

(54) ANALOG-TO-DIGITAL SIGMA-DELTA MODULATOR WITH FIR FILTER FEEDBACK

(75) Inventor: Omid Oliaei, Schaumburg (IL)

(73) Assignee: Freescale Semiconductor, Inc., Austin, TX (US)

( * ) Notice: Subject to any disclaimer, the term of this patent is extended or adjusted under 35 U.S.C. 154(b) by 184 days.

(21) Appl. No.: 10/381,075

(22) Filed: Mar. 18, 2003

(65) Prior Publication Data

US 2005/0052299 A1   Mar. 10, 2005

(30) Foreign Application Priority Data

Mar. 20, 2002   (EP) .................................. 02290696

(51) Int. Cl.
  *H03M 3/00*   (2006.01)
  *H03M 1/12*   (2006.01)
(52) U.S. Cl. ...................................... 341/143; 341/155
(58) Field of Classification Search ................ 341/143, 341/155, 118, 120, 161; 708/300, 819, 319, 708/313; 375/232, 229
See application file for complete search history.

(56) References Cited

U.S. PATENT DOCUMENTS 5,274,375 A * 12/1993 Thompson ................... 341/143
5,608,400 A * 3/1997 Pellon ......................... 341/143

(Continued)

FOREIGN PATENT DOCUMENTS

EP    0617516 A1   9/1994

OTHER PUBLICATIONS

Okamoto et al., "A Stable High-Order Delta-Sigma Modulator with an FIR Spectrum Distributor," IEEE Journal of Solid-State Circuits, Jul. 28, 1993, No. 7, pp. 730-734.

(Continued)

*Primary Examiner*—Patrick Wamsley
(74) *Attorney, Agent, or Firm*—James L. Clingan, Jr.

(57) ABSTRACT

An analog-to-digital sigma-delta modulator for converting analog input signals to digital output signals comprises a feedback path (1, 101, 201) for producing analog feedback signals that are a function of the digital output signals (y, Y), an 'N'-stage ('N'=2) integrator path (9 to 14, 109 to 114) for integrating analog difference signals that are a difference function of the input signal and the analog feedback signals, and a quantizer (3, 103) responsive to the signals integrated by the integrator means (9 to 14, 109 to 114) for producing the digital output signals (y, Y) at clock intervals. The feedback path includes 'N' feedback stages (15 to 17, 115 to 117) for respective integrator stages (9 to 14, 109 to 114).

Each of the 'N' feedback stages (15 to 17, 115 to 117) comprises finite impulse response ('FIR') filters (15 to 19, 115 to 117), each of the FIR filters being of the same order 'M', where 'M' is at least two; at least the filter (15, 115) of the feedback stage that feeds back to the first integrator stage is a low pass filter.

The integrator stages may be discrete-time integrators; the FIR filters reduce their sensitivity to feedback voltage step changes that would cause non-linearities due to slew-rate limitations. Alternatively, the integrator stages may be continuous-time integrators; the FIR filters reduce their sensitivity to clock pulse jitters. In the embodiment shown in FIG. 11, the first integrator stage (109, 110) is a continuous-time integrator stage, and the remainder of the integrator stages (11 to 14) are discrete-time integrator stages.

8 Claims, 7 Drawing Sheets

U.S. PATENT DOCUMENTS

| | | | | |
|---|---|---|---|---|
| 5,673,044 A | * | 9/1997 | Pellon | 341/143 |
| 5,742,246 A | * | 4/1998 | Kuo et al. | 341/143 |
| 6,060,950 A | | 5/2000 | Groc | |
| 6,707,409 B1 | * | 3/2004 | Ignjatovic et al. | 341/143 |
| 6,765,517 B1 | * | 7/2004 | Ali | 341/143 |
| 6,839,012 B1 | * | 1/2005 | Kawamura | 341/143 |
| 6,842,128 B1 | * | 1/2005 | Koh | 341/143 |

OTHER PUBLICATIONS

Su et al., "A CMOS Oversampling D/A Converter with a Urrent-Mode Semidigital Reconstruction Filter," IEEE Journal of Solid=State Circuits, Dec. 28, 1993, No. 12, pp. 1224-1233.

EPO Search Report, Sep. 28, 1994.

* cited by examiner

ANALOG-TO-DIGITAL SIGMA-DELTA MODULATOR WITH FIR FILTER FEEDBACK

FIELD OF THE INVENTION

This invention relates to analog-to-digital sigma-delta modulators.

BACKGROUND OF THE INVENTION

Sigma-delta modulators are now widely used for conversion between analog and digital signals, especially with advances in very large-scale integrated circuit technology (VLSI).

An article by P. M. Aziz, H. V. Sorensen and J. van der Spiegel in IEEE Signal Processing magazine, January 1996 gives an overview of analog-to-digital sigma-delta modulators as used in analog-to-digital converters for example. An article by P. F. Ferguson, Jr. A. Ganesan and R. W. Adams, "One Bit Higher-Order Sigma-Delta A/D Converters", IEEE International Symposium on Circuits and Systems, pp. 890–893, 1990 gives a presentation of the general form of higher-order signal-delta modulators including filters in both feed-forward and feedback paths.

Figure 1:
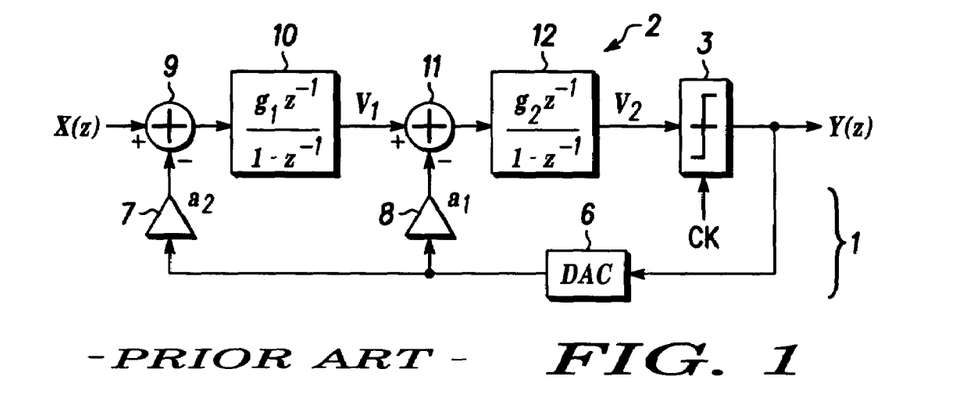
FIG. 1 is a block schematic diagram of a typical basic second order discrete-time sigma-delta modulator.
Figure 2:
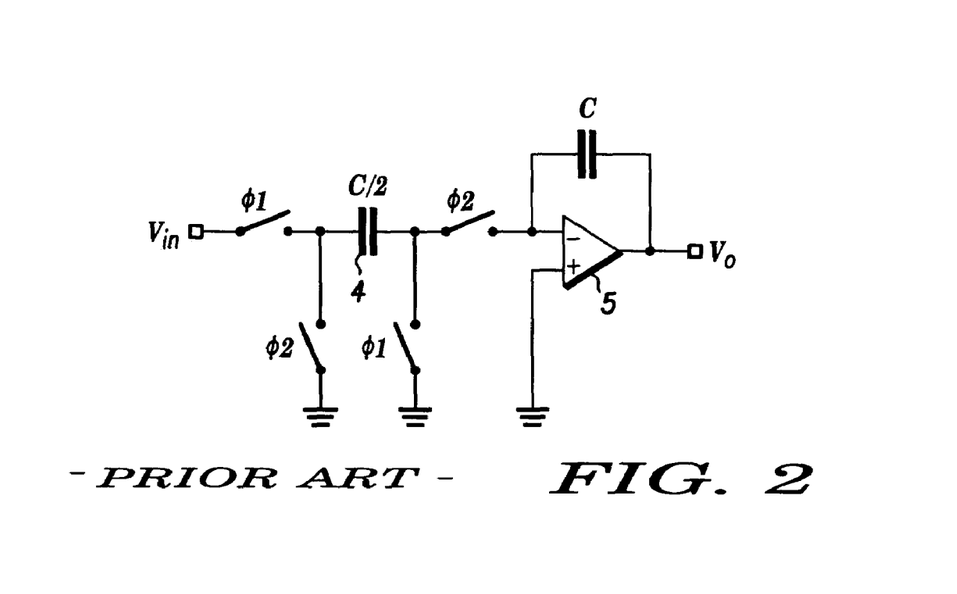
FIG. 2 is a schematic diagram of a typical switched-capacitor integrator stage in the modulator of FIG. 1.
Figure 3:
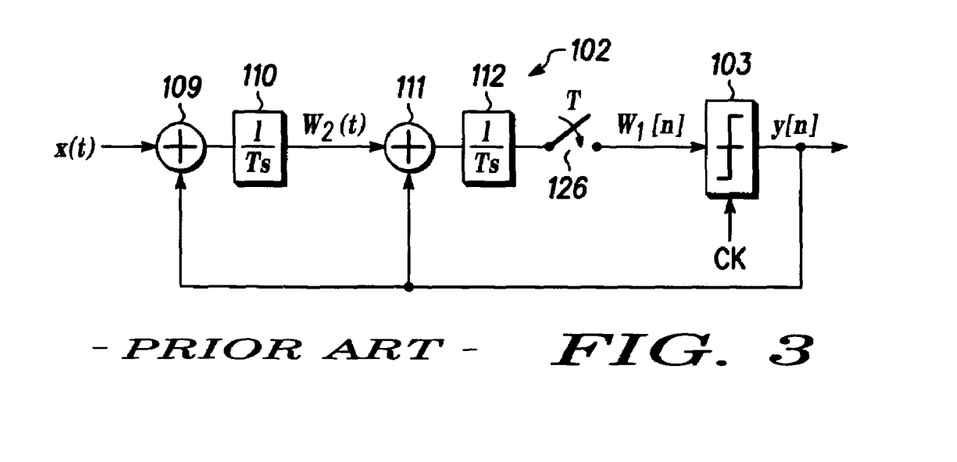
FIG. 3 is a schematic diagram showing the operation of a typical basic second-order continuous-time sigma-delta modulator.

Two basic kinds of sigma-delta modulators exist: discrete-time and continuous-time. FIG. 1 of the accompanying drawings shows a typical basic discrete-time sigma-delta modulator of second order (that is to say comprising two integrator stages) and FIG. 2 shows the circuit configuration of a typical switched-capacitor integrator stage in the modulator of FIG. 1. FIG. 3 shows the transfer functions of a typical basic second order continuous-time sigma-delta modulator.

In general terms, an analog-to-digital sigma-delta modulator receives analog input signals X (that is to say whose amplitude represents data) and converts them at clock intervals to encoded digital output signals Y (that is to say pulses whose amplitude is constant and whose repetition rate represents the data). The modulator comprises a feedback path 1 for producing analog feedback signals that are a function of the digital output signals, an integrator 2 for integrating analog difference signals that are a difference function of the analog input signal and the analog feedback signals, and a quantizer 3 responsive to the signals integrated by the integrator 2 for producing the digital output signals at clock intervals defined by a clock signal CK.

An article by D. K. Su and B. A. Wooley, "A CMOS Oversampling D/A Converter with a Current-Mode Semi-digital Reconstruction Filter", IEEE Journal of Solid-State Circuits, Vol. 28, No. 12, December 1993, pp. 1224–1233 gives a description of a digital-to-analog modulator including a finite impulse response ('FIR') filter, in particular a semi-digital FIR filter in the output path. The technique proposed is not applicable to an analog-to-digital modulator.

In U.S. Pat. No. 5,357,252, assigned to the assignee of the present invention, first-order FIR filtering in the feedback path of the first stage of an analog-to-digital modulator is proposed to combat the pattern noise. This method changes the noise transfer function of the modulator and its extension to higher-order filtering is not practicable.

An article by T. Okamoto, Y. Maruyama and A. Yukawa, "A Stable High-Order-Delta-Sigma Modulator with an FIR Spectrum Distributor", IEEE Journal of Solid-State Circuits, Vol. 28, No. 7, pp. 730–735, July 1993, describes a noise-shaper circuit including an FIR spectrum distributor, used to improve the stability of higher-order modulators. The order of FIR filtering is limited to twice the modulator order. The orders of the successive FIR filters are not the same but are stepped from one up to the modulator order along the feedback path. No improvement in terms of power or distortion is apparent in this architecture. It is noted that the article describes a digital-to-analog modulator whose feedback path includes a plurality of feedback stages including finite impulse response filters of differing orders.

Concerns that arise in the design of analog-to-digital sigma-delta modulators include their sensitivity to the effects of feedback voltage step changes and clock pulse instabilities. The present invention provides novel analog-to-digital sigma-delta modulators that address these concerns, among others.

SUMMARY OF THE INVENTION

The present invention provides an analog-to-digital sigma-delta modulator as described in the accompanying claims.

DETAILED DESCRIPTION OF THE PREFERRED EMBODIMENTS

The design of a sigma-delta modulator must take account of many different criteria and achieve a suitable compromise between sometimes conflicting requirements. Thus, power consumption in a sigma-delta modulator is a direct function of its sampling frequency and dynamic range. Sampling capacitors such as 4 in the discrete-time switched-capacitor (SC) implementation shown in FIG. 2 of an stage of the integrator 2 shown in FIG. 1 are chosen with regard to the thermal noise, KT/C. On the other hand, capacitors determine the circuit speed. Transient response requirements for an SC-integrator in a sigma-delta modulator depend on: the total load capacitance, the amplifier architecture and the input signal activity.

During the integration phase, the output of an SC-integrator 2 changes from an initial level to a new level. For large input voltage steps, the integrator amplifier 5 first goes through a large-signal response and when the output signal approaches the final level, the integrator settles according to its small-signal performance. The large-signal transient response of an operational amplifier is dominated by its slew-rate while its small-signal performance depends on its gain-bandwidth and phase margin. For a given clock frequency, reducing the voltage steps allows for an integrator amplifier 5 with a smaller slew-rate.

In the prior art discrete-time sigma-delta modulator structure shown in FIG. 1, the feedback path 1 includes a digital-to-analog converter 6 that converts the output signal Y(z) to an analog signal that is fed back at each clock pulse to each of two feedback amplifiers 7 and 8 having respective gains $a_2$ and $a_1$. The feedback signal from the first stage amplifier 7 is applied to the subtraction input of an adder 9, whose addition input receives the analog input signal X(z), the output of the adder 9 being applied to the input of a first integrator stage 10. Likewise, the feedback signal from the second stage amplifier 8 is applied to the subtraction input of an adder 11, whose addition input receives the first integrator stage 10, the output of the adder 11 being applied to the input of a second integrator stage 12. The gains $a_2$ and $a_1$ of the feedback amplifiers 7 and 8 determine the respective feedback coefficients.

In such a prior art sigma-delta modulator, the feedback path is responsible for the abruptness of the voltage variations. The embodiments of the present invention shown in FIGS. 4 to 11 of the drawings enable improvements in this and other respects; they use finite impulse response ('FIR') filters in the feedback path of the modulator. At least the FIR filter in the feedback path of the first integrator stage is a low pass filter. The FIR filters feed back an analog signal at each clock pulse whose magnitude is a function not only of the output signal Y(z) at the current (immediately preceding) clock pulse but also of its value at previous clock pulses, the order of the FIR filter being defined as the number of clock pulses that it can take into account. The orders of the FIR filters are the same for each integrator stage. One consequence is to reduce the abruptness of the voltage variations, reducing the slew rate and hence the harmonic distortion of the integrator amplifiers 5, especially at the first stage 10. Moreover, if this can be achieved without increasing the capacitive load of the integrator amplifier 5 of the first stage 10, a substantial saving in power consumption can be obtained.

Figure 4:
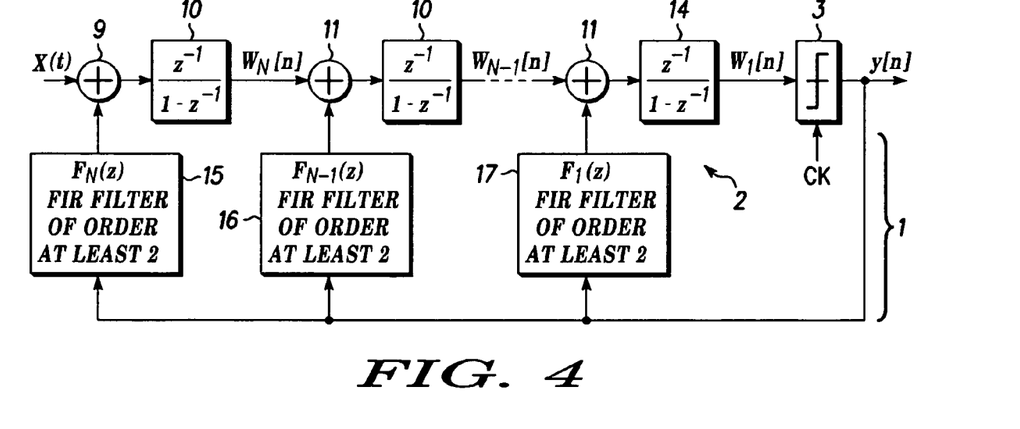
FIG. 4 is a schematic diagram showing transfer functions of a basic Nth order discrete-time sigma-delta modulator in accordance with one embodiment of the invention, given by way of example.

Referring now to FIG. 4, a discrete-time sigma-delta modulator of nth order in accordance with an embodiment of the present invention is shown including an integration path 2, a quantizer 3 and a feedback path 1. The integration path includes N integrator stages of which the first and second stages 10 and 12 and the Nth stage 14 are shown, together with associated feedback adders 9, 11 and 13 respectively. The output signal y[n] is fed back to respective FIR filters of which filters 15 and 16 are shown for the first and second stages and 16 for the Nth stage. In this embodiment, all the FIR filters produce an analog feedback signal that is a function of the preceding M clock intervals of the output signal y[n]. The first stage FIR filter 15 is a low pass filter. The analog feedback signals from the FIR filters 15 to 17 are applied to the negative inputs of the adders 9 to 13 respectively. The analog feedback signal from an FIR filter i is a function $F_i(z)$ of the output signal.

Figure 5:
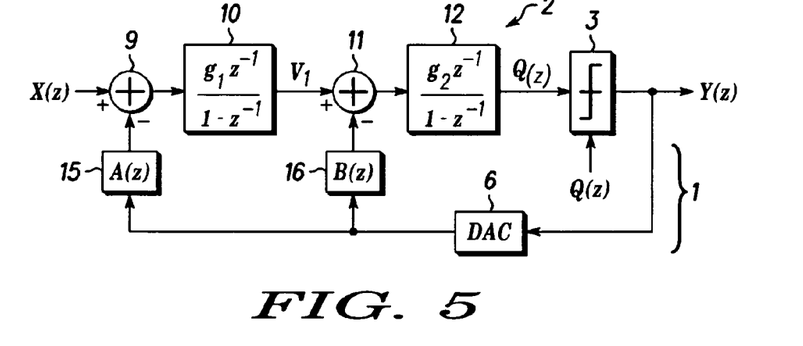
FIG. 5 is a block schematic diagram of a basic second order discrete-time sigma-delta modulator of the kind shown in FIG. 4.

In calculating the coefficients for the FIR filters, it is convenient to calculate the function $F_N(z)$ of the first filter 15 initially and then calculate the coefficients of the subsequent FIR filters to achieve the target noise transfer function. Such calculations will be described with reference to FIG. 5, which is a block schematic diagram of a second order sigma-delta modulator of the kind shown in FIG. 4. The FIR filters 15 and 16 are analog filters, both of the same order M. The output of the modulator can be written in the z-domain as:

$$Y(z) = \frac{z^{-2}X(z) + (1-z^{-1})^2 Q(z)}{D(z)} \quad \text{Equation 1}$$

where (Qz) is the noise introduced by the quantizer 3, $k_2 = g_2$, $k_1 = g_1 g_2$, and $$D(z) = (1-z^{-1})^{-2} + k_2 B(z) z^{-1}(1-z^{-1}) + k_1 A(z) z^{-2}$$

The transfer function A(z) and B(z) of the FIR filters 15 and 16 can be written as:

$$A(z) = a_0 + a_1 z^{-1} + a_2 z^{-2} + \ldots = \sum_{m=1}^{M} a_m z^{-m} \quad \text{Equation 2}$$

$$B(z) = b_0 + b_1 z^{-1} + b_2 z^{-2} + \ldots = \sum_{m=1}^{M} b_m z^{-m} \quad \text{Equation 3}$$

If for the sake of simplicity, D(z) is required to remain a second order polynomial, it follows that:

$$D(z) = 1 + \alpha z^{-1} + \beta z^{-2} \quad \text{Equation 4}$$

The coefficients of A(z) can be obtained as:

$$a_0 + a_1 + \ldots + a_M = \frac{\alpha + \beta + 1}{k_1} \quad \text{Equation 5}$$

and the coefficients of B(z) can then be calculated.

In a practical implementation, calculation of an ideal filter from quadratic programming offers the optimum noise suppression for a given filter length. In practical integrated circuit design, it is convenient to implement all coefficients using capacitors that are integer multiples of a unit capacitor and, in a particular embodiment of the present invention, a comb filter is used as the FIR filter 15 for the first integrator stage, that is to say in which all the coefficients of the filter are equal. The optimum coefficients for this sub-ideal filter are:

$$a_0 = a_1 = \ldots = a_M = \frac{\alpha + \beta + 1}{k_1(M+1)} \qquad \text{Equation 6}$$

The corresponding optimum values for the second integrator stage FIR filter can be shown to be:

$$\left.\begin{array}{l} b_0 = \dfrac{\alpha + 2}{k_2} \\ b_m = \dfrac{(M - m + 1)(\alpha + \beta + 1)}{k_2(M+1)} m = 1, \ldots, M-1 \end{array}\right\} \quad \text{Equation 7}$$

Examples of the FIR filter coefficients for M=0 (corresponding to a modulator as shown in FIG. 1) and FIR filters of orders 1 to 5 (corresponding to the modulator of FIG. 5 in accordance with this embodiment of the invention) are summarized in the following table:

| M | $a_0$ | $a_1$ | $a_2$ | $a_3$ | $a_4$ | $a_5$ | $b_0$ | $b_1$ | $b_2$ | $b_3$ | $b_4$ | $b_5$ | $\Sigma b_m$ |
|---|---|---|---|---|---|---|---|---|---|---|---|---|---|
| 0 | 1 | | | | | | 1 | | | | | | 1 |
| 1 | ½ | ½ | | | | | 1 | ¼ | | | | | 1.25 |
| 2 | ⅓ | ⅓ | ⅓ | | | | 1 | ⅓ | ⅙ | | | | 1.5 |
| 3 | ¼ | ¼ | ¼ | ¼ | | | 1 | ⅜ | ¼ | ⅛ | | | 1.75 |
| 4 | ⅕ | ⅕ | ⅕ | ⅕ | ⅕ | | 1 | 4/10 | 3/10 | 2/10 | 1/10 | | 2.00 |
| 5 | ⅙ | ⅙ | ⅙ | ⅙ | ⅙ | ⅙ | 1 | 5/12 | ⅓ | ¼ | ⅙ | 1/12 | 2.25 |

The last column of the table shows the sum of coefficients of b(z), which represents the factor by which the feedback capacitor of the second integrator increases.

Figure 6:
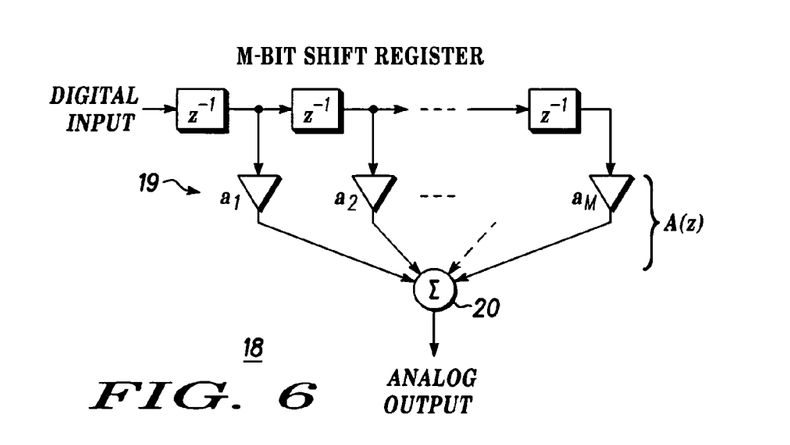
FIG. 6 is a schematic diagram showing transfer functions of a semi-digital finite impulse response filter in the sigma-delta modulator of FIG. 5.

The FIR filters used in the embodiments of the present invention shown in FIGS. 4 to 11 of the accompanying drawings may be purely digital filters, which require multi-bit DACs in addition. However, in the preferred embodiments of the present invention, semi-digital FIR filters are used having transfer functions as illustrated in FIG. 6 of the drawings. For a filter of order M, M successive flip-flop circuits form an M-bit shift register 18. The digital signals at successive stages of the shift register 18 control respective amplifier stages 19 whose gains $a_1$, $a_2$ to $a_M$ define the amplitudes of corresponding analog signals that define the coefficients of the filter and are summed at 20.

Figure 7:
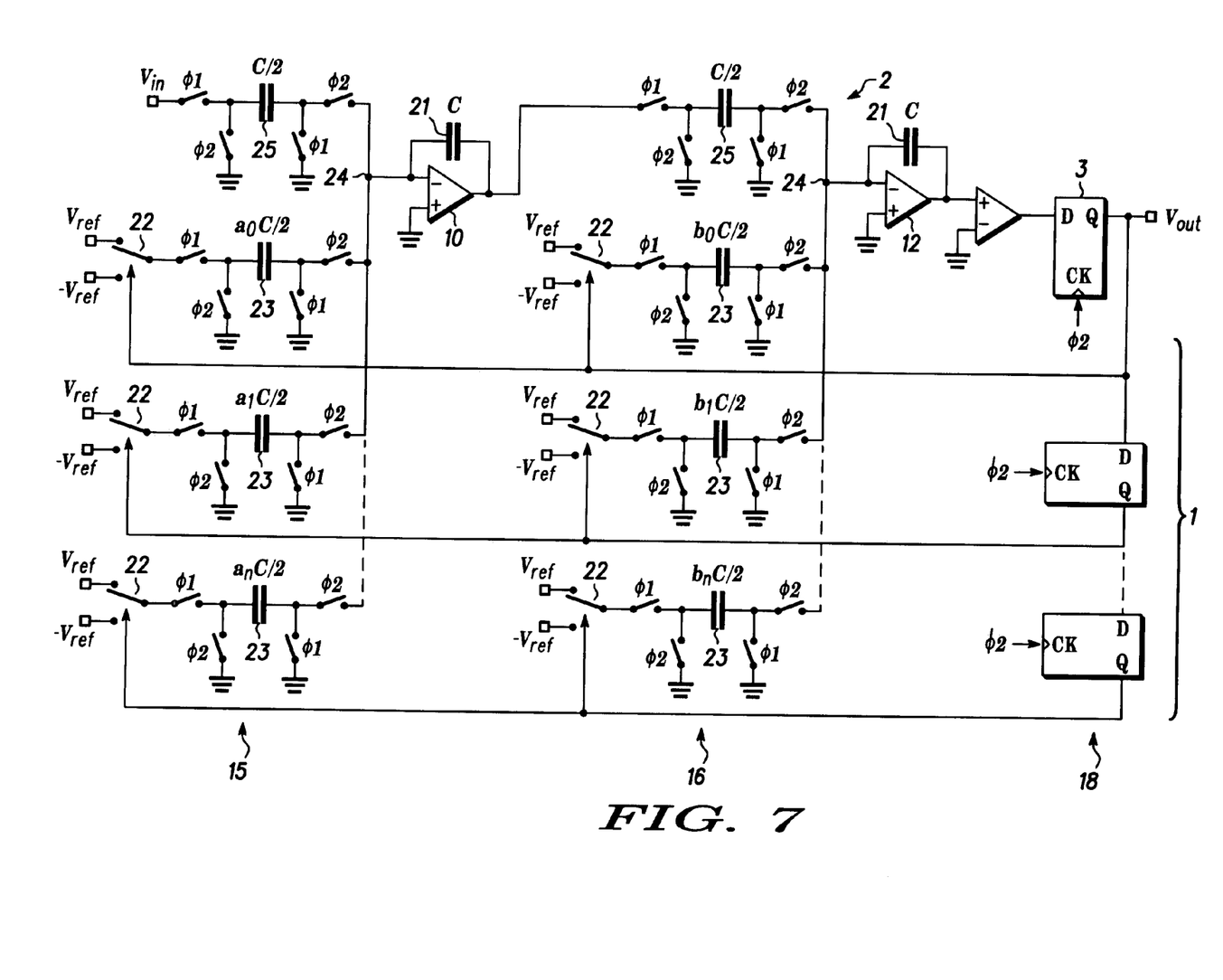
FIG. 7 is a circuit diagram of the discrete-time sigma-delta modulator of FIG. 5.

FIG. 7 shows a practical implementation of a preferred embodiment of the discrete-time modulator of FIG. 5 with semi-digital FIR filters as shown in FIG. 6. This embodiment of the invention is implemented in switched-capacitor technology in the feedback path 1, the amplification and addition transfer functions indicated by elements 19 and 20 in FIG. 6 being achieved by the connections of capacitors 23 in the FIR filters alternately with reference voltages and with the amplifiers 10 and 12 of the integrator stages; the switching of the capacitors 23 at controlled phases of the clock cycles, the sizes chosen for the capacitors and the magnitudes of the reference voltages define the coefficients of the FIR filter transfer functions.

Each stage of each FIR filter comprises a voltage reference switch 22 that switches between voltage references $+V_{ref}$ and $-V_{ref}$ under the control of the corresponding stage of the shift register 18. The voltage at the pole of the switch 22 is sampled during one phase of the clock cycle by the closure of a switch φ1 connected to the left plate of capacitor 23 whose right plate is connected to ground through another switch closed at phase φ1. The left plate of the capacitor 23 is connected to ground through a switch that is closed at phase φ2 of the clock cycle and the right plate is connected through another switch that is closed at phase φ2 to the input 24 of the integrator amplifier of the corresponding stage of the integrator 2. Respective integrator capacitors 21 are connected between the outputs and the inputs of each of the integrator amplifiers 10 and 12. The input voltage for each stage of the integrator 2, the input voltage $V_{in}$ of the integrator 2 or the ouput of the first stage amplifier 10 as the case may be, is supplied through a phase φ1 switch to the left hand plate of a sampling capacitor 25 whose right plate is connected to ground through another phase φ1 switch and the left hand plate of the capacitor 25 is connected to ground through a phase φ2 switch, the right hand plate of the capacitor 25 being connected to the integrator amplifier input 24 through a phase φ2 switch.

If the size of the integrator capacitor 21 is C, the size of the capacitor 23 of the mth stage of the FIR filter 15 of the first integrator stage is chosen to be $a_m C/2$ and the size of the sampling capacitor 25 is chosen to be C/2 for $g_1 = \frac{1}{2}$ and $g_2 = \frac{1}{2}$. Similarly, for the mth stage of the FIR filter 16 of the second integrator stage, the size of the filter capacitor 23 is chosen to be $b_m C/2$. The values $a_m$ and $b_m$ correspond to the values of the coefficients of the FIR filter transfer function.

It will be appreciated that the description given above with reference to FIGS. 4 to 7 of the accompanying drawings relates to the basic sigma-delta modulator functions and that additional functions may be utilised. In particular, double sampling may be used, which consists of applying the feedback signal on both clock phases so as to balance the capacitive load seen by the integrator amplifiers during each clock phase. Since the architecture using FIR filters comprises capacitors split into several capacitor elements, this need not involve the addition of supplementary capacitors, it being sufficient to divide the capacities of each FIR filter into two bunches of capacitor elements controlled by the different clock phases.

In addition, feed forward, interpolation and resonance paths may be added.

The choice of the order of the FIR filters, which are identical for each integrator stage, may be a compromise. A higher order decreases the voltage steps applied to the integrator first stage, enables the speed of the first stage to be reduced and hence enables a reduction in the parasitic capacitance and power consumption of the first integrator stage. On the other hand, a lower order FIR filter reduces the complexity of the clock routing connections. A suitable compromise for a two-stage discrete-time integrator may be a fourth or fifth order for the FIR filters.

The discrete-time sigma-delta modulator embodiments of the present invention described above with reference to FIGS. 4 to 7 are of substantial interest because of the inherent properties that switched capacitor technology offers. However, even with the benefit of the present invention, they present disadvantages in certain circumstances. For example, the full bandwidth of the amplifiers is not exploited, due to the fact that the amplifier's bandwidth must be several times larger than the sampling frequency so that the integrators settle completely within each clock phase. Also, due to the sampling operation, broadband thermal noise is folded back into the band-of-interest ('aliasing') and has to be countered.

The present invention is also applicable to continuous-time ('CT') sigma-delta modulators. In continuous-time modulators the amplifier bandwidth can be quite close to the sampling frequency and thermal noise is not aliased. In addition, the structure inherently presents an anti-aliasing pre-filtering with regard to the input signal. However, a prior art CT-modulator such as shown in FIG. 3 is sensitive to clock jitters, which are random variations of the clock edge. These corrupt the feedback signal and give rise to in-band noise. The use of FIR filters in the feedback path enables improvements in these respects also due to the averaging effect of the filters.

The operation of a typical basic second-order continuous-time sigma-delta modulator is illustrated schematically in FIG. 3. The analog input signal X, in the time domain, passes through analog integrator stages 110 and 112 that have a time constant $T_S$ and is sampled by a sampling switch 126 at the end of the integrator path 102 before passing to the quantizer 103, the feedback path 101 supplying analog signals to the negative inputs of the adders 109 and 111.

The analog feedback signal is a rectangular pulse of duration $\tau$ and with a delay $t_d$ with respect to the quantizer clock. In the case of the second-order modulator of FIG. 3, clock jitters modulating the pulse duration $\tau$ result in an output spectrum containing both white and first order shaped noise:

$$S_{\varepsilon_\tau}(z) = \left(\frac{\sigma_\tau^2}{T^2}\right)[1 + \alpha(1 - z^{-1})][1 + \alpha(1 - z)] \quad \text{Equation 2}$$

where $\sigma_\tau^2$ is the variance of the effect of the clock jitter on the pulse width $\tau$,
$\alpha=-2+\tau/(2T)$ and
T is the clock period.

The result of pulse duration jitters in the output spectrum is both a white noise component and a first order shaped noise, the latter being of substantially reduced importance, due to the output filters.

The effect of clock jitters on the pulse delay, on the other hand, give rise to a first order shaped noise spectrum:

$$S_{\varepsilon_{t_d}} = \left(\frac{\sigma_{t_d}^2}{T^2}\right)[1 - z^{-1}][1 - z] \quad \text{Equation 9}$$

The white noise component can be represented by an error $\varepsilon_2=\sigma_\tau/\tau$ added at the input of the first integrated stage and the shaped noise components correspond to errors $\varepsilon_1=\alpha\sigma_\tau/\tau+\sigma_{t_d}/T$ added at the input of the second integrator stage. It follows that the first stage is the most critical for the deterioration of the performance of the modulator in respect of clock jitters. It also follows that increasing the integration order of a continuous time modulator of this type does not significantly reduce the effect of clock jitters.

Figure 8:
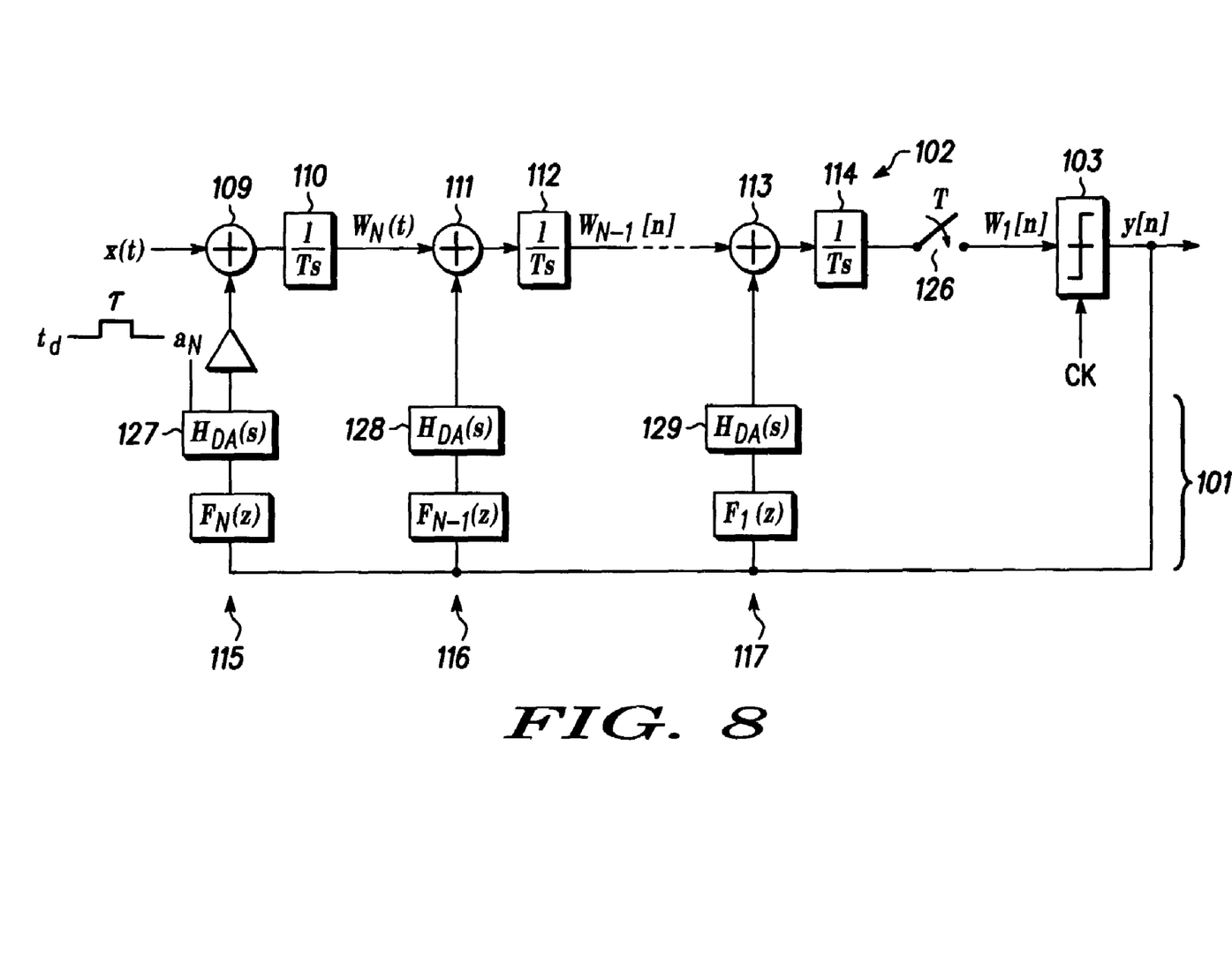
FIG. 8 is a schematic diagram showing the operation of a basic Nth order continuous-time sigma-delta modulator in accordance with another embodiment of the invention.

FIG. 8 shows a continuous-time sigma-delta modulator in accordance with another embodiment of the present invention. In the modulator of FIG. 8, the feedback path 101 includes FIR filters 115, 116, and 117 having analog-to-digital transfer functions $H_{DA}(S)$ shown at 127, 128 and 129 that supply respective analog feedback signals to the adders 109, 111 and 113 with respective coefficients. The modulator of FIG. 8 offers a substantial improvement in respect of sensitivity to clock jitters compared to the modulator of FIG. 3.

Choice of the coefficients of the transfer function of the first FIR filter for the first integrator stage 110 of the modulator of FIG. 8 depends on the nature of the input signal. Once the coefficients of the first FIR filter 115 have been obtained, the coefficients of the other filters 116 and 117 can be calculated to reach the desired noise transfer function, as before. The loop transfer function of the continuous-time modulator may be equated with that of a corresponding discrete-time modulator for the purposes of calculating the coefficients.

A satisfactory solution when the input signal is unknown or when the optimum spread of filter coefficients is troublesome for analog implementation is again the use of a comb filter, as described above for the discrete-time modulator.

Figure 9:
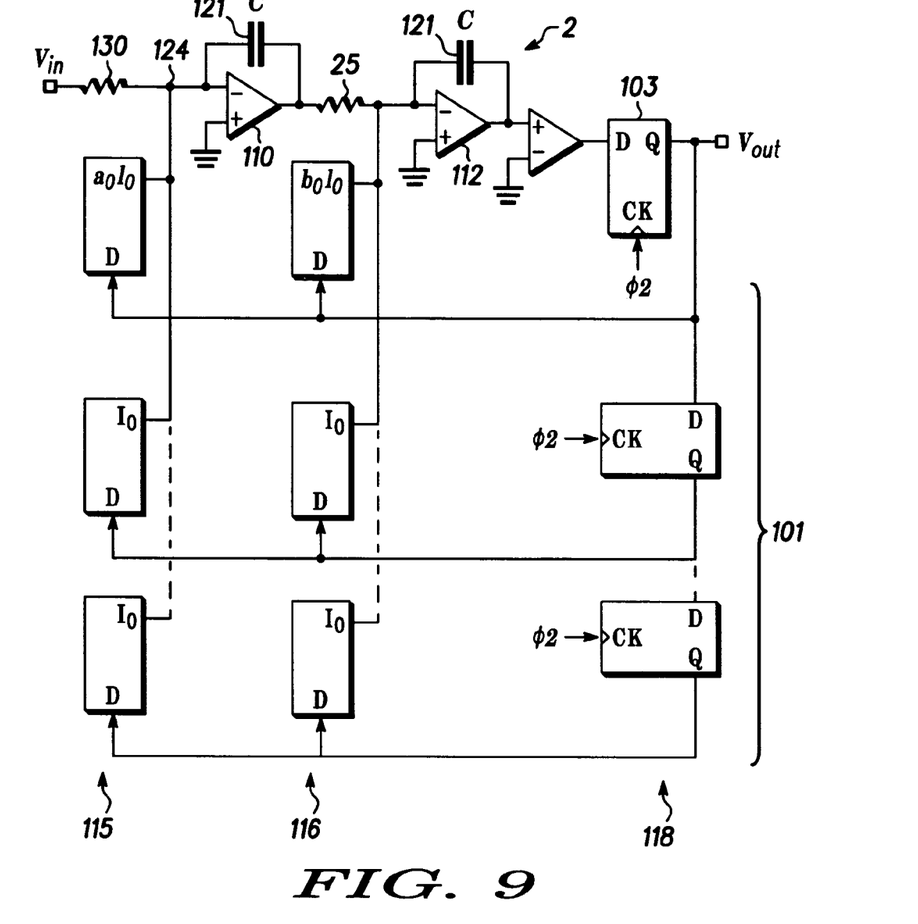
FIG. 9 is a block schematic diagram of a basic second order continuous-time sigma-delta modulator of the kind shown in FIG. 8, given by way of example.

FIG. 9 shows a second order continuous time modulator implementation in which the input signal $V_{IN}$ is supplied to the input 124 of the analog amplifier of the first integrator stage 110 through a resistor 130 and the output of the amplifier of the first integrator stage 110 is supplied to the input of the amplifier of the second integrator stage 112 through a resistor 131. The low pass FIR filters of order M are formed by current switch circuits triggered by the corresponding stages of an M-stage shift register 118, the output currents from the stages of each FIR filter being summed and supplied to the input 124 of the corresponding integrator amplifier. The structure and operation of this continuous-time modulator resembles thus far that of the discrete-time modulator of FIG. 7.

Figure 10:
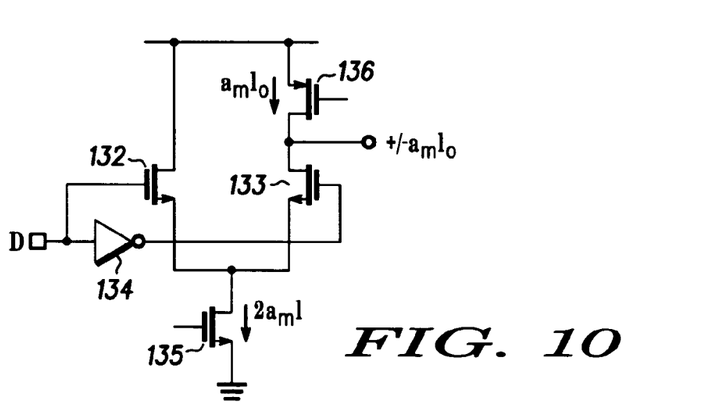
FIG. 10 is a circuit diagram of a current switch and proportioning circuit in he sigma-delta modulator of FIG. 9.

A preferred embodiment of the nth stage of an FIR filter is shown in FIG. 10. The D input of the stage receives the Q signal from the corresponding stage of the shift register 118. The input D is applied to the gates of a differential pair of transistors 132 and 133, the gate of transistor 133 being supplied through an inverter 134. The coefficient of this stage of the filter $A_M$ is defined by a transistor 135 connected in series between the common source of transistors 132 and 133 and ground. A current source transistor 136 is connected in series between the drain of the transistor 133 and the voltage supply and the junction between transistors 133 and 136 supplies the output current of the stage to the amplifier input 124.

In both CT and DT modulators, the first stage is the most critical. In fact, the circuit imperfections are dominated by those generated by the first stage. These imperfections are essentially thermal noise, harmonic distortion and jitter-induced noise. For this reason the first stage is the most power and area consuming block.

Figure 11:
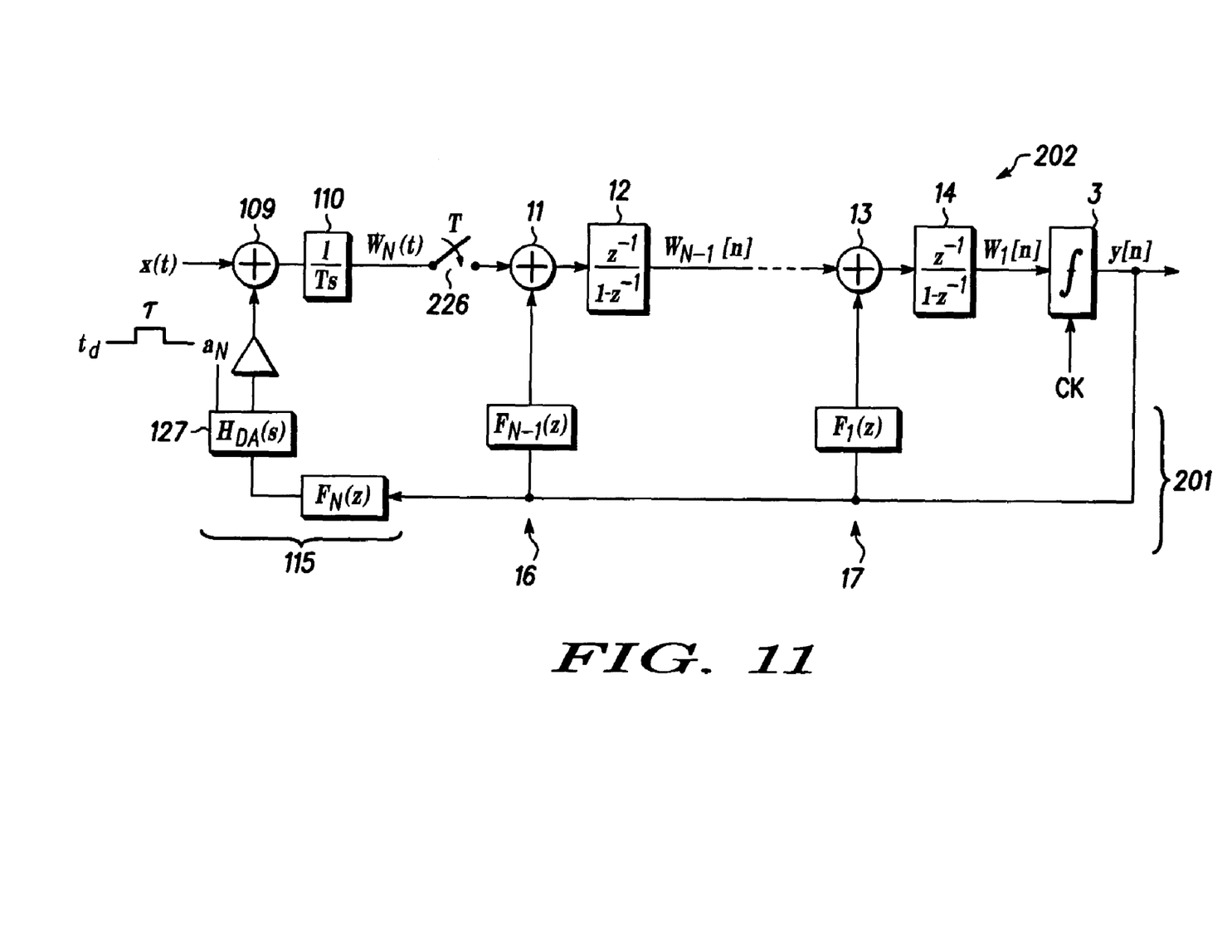
FIG. 11 is a schematic diagram showing transfer functions of a basic Nth order mixed-time sigma-delta modulator in accordance with yet another embodiment of the invention, given by way of example.

Yet another embodiment of the present invention, shown in FIG. 11, and including FIR filters in the feedback path, is a mixed-time (MT) sigma-delta modulator, that is to say that the first integrator stage of the modulator is a continuous-time integrator and the other stages are discrete-time integrators. The first CT-integrator stage reduces drastically the power consumption and silicon area of the integrated circuit and the FIR filtering in the feedback path reduces its sensitivity to clock jitters; the subsequent DT integrator stage(s) are relatively insensitive to clock jitters so that, overall, the MT modulator is much less sensitive to clock jitters.

In a practical implementation of the mixed-time sigma-delta modulator of the kind shown in FIG. 11, the first stage of the modulator, comprising adder 109, integrator 110 and FIR filter 115, having digital-to-analog transfer function 127 is similar to the first stage of the CT-modulator described with reference to FIGS. 8, 9 and 10. A sampling switch 226 samples the output of the first integrator stage 110. The following stages are discrete-time integrator stages comprising adders 11 and 13 and integrator stages 12 and 14 together with feedback paths 16 and 17, similar to the second and higher order integrator stages and associated feedback stages described with reference to FIGS. 4 to 7. The FIR filters 115, 16 and 17 in the preferred embodiment are again semidigital low-pass filters. In a sub-ideal embodiment, the FIR filter 115 for the first integrator stage conveniently may be implemented as a comb filter.

In a practical second order modulator of this kind, with gain of each of the integrator stages 110 and 12 of 0.5, and with approximately the ideal FIR filter coefficients, but enabling use of unit capacitors in simplified circuits, optimum values of the coefficients were calculated as follows, the figures being only an example of the choice made for one particular modulator:

for the first stage FIR filter 115

| $a_0$ | $a_1$ | $a_2$ | $a_3$ | $a_4$ |
|---|---|---|---|---|
| 4/40 | 10/40 | 12/40 | 10/40 | 4/40 | for the second stage FIR filter 16

| $b_0$ | $b_1$ | $b_2$ | $b_3$ | $b_4$ |
|---|---|---|---|---|
| 1 | 80/200 | 40/200 | 40/200 | 0 |

In calculating the improvement obtained with this type of circuit compared to the modulators of FIGS. 1 to 3, the effect of clock jitters may be estimated, to a close approximation, by calculating the effect of pulse width jitters on the first stage. The transfer function of the filter can be written as:

$$F_N = \sum_{m=0}^{M} f_m z^{-m} \quad \text{Equation 10}$$

It can be shown that the white noise spectrum that results at the output from clock pulse width jitters at the first stage is:

$$S_\varepsilon(z) = \left(\frac{\sigma_\tau^2}{\tau^2}\right)\left(\sum_{p=0}^{M}\sum_{q=0}^{M} f_p f_q \mathcal{R}_y[p-q]\right) \quad \text{Equation 11}$$

where $\mathcal{R}_y$ is the output auto-correlation function of the modulator. The improvement in the result at the modulator output of clock pulse width jitters at the first integrator stage compared to the modulator of FIG. 3 is a factor IP of $$\left[\sum_{p=0}^{M}\sum_{q=0}^{M} f_p f_q \mathcal{R}_y[p-q]\right].$$

To a first approximation, the modulator output spectrum due to clock pulse width jitters at the first stage is less than:

$$S_\varepsilon(e^{j\omega}) = \left(\frac{\sigma_\tau^2}{\tau^2}\right)(A^2/2) + \Theta \quad \text{Equation 12}$$

where A is the amplitude of the input signal applied to the modulator and $\Theta$ is a factor related to N, the number of integrator stages, and M, the order of the FIR filters.

Calculation shows that the worst case for the effect of clock jitters on the modulator output is when the input signal frequency is in the pass band of the low pass FIR comb filter 115 of the first integrator stage 110. Two extreme cases can be distinguished: the noise tends towards a constant value for small signals, the noise value being smaller for higher order FIR filters. On the other hand, for large amplitude input signals, the output noise is signal dependent.

$$S_\varepsilon(e^{j\omega}) = \begin{cases} \left(\frac{\sigma_\tau^2}{\tau^2}\right)(\Theta) & A \to 0 \\ \left(\frac{\sigma_\tau^2}{\tau^2}\right)(A^2/2) & A \to A_{\max} \end{cases} \quad \text{Equation 13}$$

Figure 12:
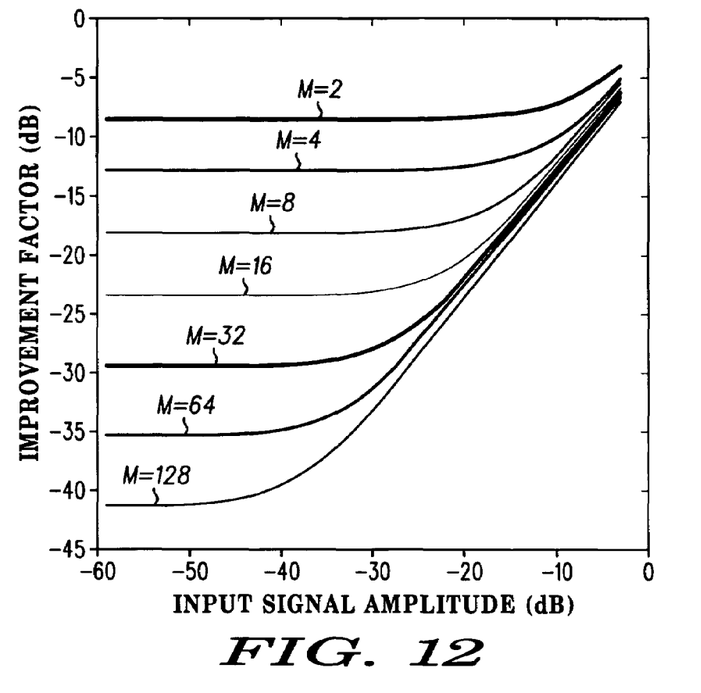
FIG. 12 is a graph showing an improvement factor of a modulator of the kinds shown in FIG. 8 and FIG. 11 relative to a modulator of the kind shown in FIG. 3 as a function of input signal amplitude.

The calculated values of $S_\varepsilon(e^{j\omega})$ are shown for an example of a second order modulator in FIG. 12. At least an improvement of 3 dB may be obtained relative to the modulators of FIGS. 1 to 3, even at large-signal amplitudes. For an input signal 3 dB less than the maximum of the input signal range, the improvement is 6 dB. If the input signal frequency falls in the stop band of the low pass filter, the improvement in large-signal performance of the system is higher.

Figure 13:
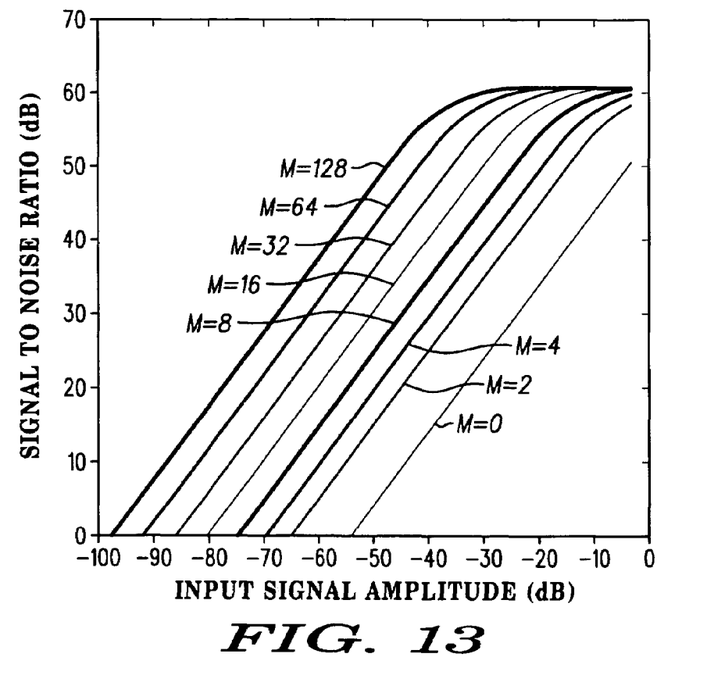
FIG. 13 is a graph showing a signal-to-noise ratio of a modulator of the kinds shown in FIG. 8 and FIG. 11 as a function of input signal amplitude.

Ignoring quantization noise, the output signal-to-noise ratio of the modulator is given by:

$$SNR = \frac{(OSR)A^2/2}{[(\sigma_\tau^2/\tau^2)(A^2/2 + \Theta) + \sigma_{th}^2]} \quad \text{Equation 14}$$

where $\sigma_{th}^2$ is the noise power and OSR is the over sampling ratio. The calculated values of SNR are shown in FIG. 13 for the same modulator as FIG. 12 second-order system for different values of the filter order M.

A major advantage of this embodiment of the invention appears especially for small signals, which significantly extends the modulator dynamic range. The dynamic range represents the capability of the system in capturing weak signals and in many applications it is more critical than $SNR_{max}$. The factor $\Theta$ with the ideal FIR filter coefficients in an example of a modulator with fourth order filters and an over sampling ratio of 32 is estimated at better than −17 dB.

In addition to reducing the effect of clock jitters at the first, continuous-time integrator stage, the low pass FIR filters have a smoothing effect that reduces voltage variations at the output of the first integrator 110 and further improves linearity and bias current requirements in the subsequent discrete-time stages.

Once again, it will be appreciated that the description given above with reference to FIGS. 8 to 11 of the accompanying drawings relates to basic sigma-delta modulator functions and that additional functions may be utilised. In particular, double sampling may be used, which consists of applying the feedback signal on both clock phases so as to balance the capacitive load seen by the integrator amplifiers during each clock phase. Once again, since the architecture using FIR filters comprises capacitors split into several capacitor elements, this need not involve the addition of supplementary capacitors, it being sufficient to divide the capacities of each FIR filter into two bunches of capacitor elements controlled by the different clock phases. In addition, feed forward, interpolation and resonance paths may be added.

I claim:

1. An analog-to-digital sigma-delta modulator for converting analog input signals to digital output signals comprising feedback path means for producing analog feedback signals that are a function of said digital output signals, integrator means for integrating analog difference signals that are a difference function of said input signal and said analog feedback signals, and a quantizer responsive to the signals integrated by said integrator means for producing said digital output signals at clock intervals, said integrator means including 'N' integrator stages, where 'N' is at least two, said input signal being applied to a first one of said integrator stages, said feedback path means including 'N' feedback stages for feeding back said feedback signals at respective integrator stages of said integrator means, and said feedback path means including finite impulse response filter means, each of said 'N' feedback stages comprising finite impulse response filter means, each of said finite impulse response filter means being of order 'M', where 'M' is at least two, and at least the filter of the feedback stage that feeds back to said first integrator stage being a low pass filter.

2. An analog-to-digital sigma-delta modulator as claimed in claim 1, wherein each of said 'N' integrator stages is a discrete-time integrator stage.

3. An analog-to-digital sigma-delta modulator as claimed in claim 2, wherein each of said finite impulse response filter means is of order 'M', where 'M' is four or five.

4. An analog-to-digital sigma-delta modulator as claimed in claim 1, wherein at least the finite impulse response filter means of the feedback stage that feeds back to said first integrator stage has substantially zero attenuation in the input signal pass-band.

5. An analog-to-digital sigma-delta modulator as claimed in claim 1, wherein each of said 'N' feedback stages is a low pass filter.

6. An analog-to-digital sigma-delta modulator as claimed in claim 1, wherein each of said 'N' integrator stages is a continuous-time integrator stage.

7. An analog-to-digital sigma-delta modulator as claimed in claim 1, wherein at least a first one of said 'N' integrator stages is a continuous-time integrator stage, the remainder of said integrator stages are discrete-time integrator stages.

8. An analog-to-digital sigma-delta modulator as claimed in claim 1, wherein only said first one of said 'N' integrator stages is a continuous-time integrator stage.

* * * * *